United States Patent [19]

Van Allan et al.

[11] 4,119,466

[45] Oct. 10, 1978

[54] SENSITIZERS FOR PHOTOCROSSLINKABLE POLYMERS

[75] Inventors: James Albert Van Allan; Michael Paul Cunningham, both of Rochester; Donald Paul Specht, Spencerport; Samir Yacoub Farid, Rochester, all of N.Y.

[73] Assignee: Eastman Kodak Company, Rochester, N.Y.

[21] Appl. No.: 829,392

[22] Filed: Aug. 31, 1977

Related U.S. Application Data

[62] Division of Ser. No. 678,805, Apr. 21, 1976, Pat. No. 4,062,686.

[51] Int. Cl.$^2$ ............................ G03C 1/68; G03C 1/52
[52] U.S. Cl. .................................. 96/115 R; 96/91 N
[58] Field of Search ...................... 96/91 N, 115 R, 75

[56] References Cited

U.S. PATENT DOCUMENTS

| | | | |
|---|---|---|---|
| T900,011 | 7/1972 | Bloom | 96/115 R |
| 2,732,301 | 1/1956 | Robertson | 96/115 R |
| 2,948,610 | 8/1960 | Merrill et al. | 96/91 N |
| 3,072,485 | 1/1963 | Reynolds | 96/91 N |
| 3,567,453 | 3/1971 | Borden | 96/91 N |
| 3,721,566 | 3/1973 | Laridon | 96/91 N |
| 3,782,938 | 1/1974 | DeBoer | 96/115 R |
| 3,870,524 | 3/1975 | Watanabe | 96/115 R |
| 3,929,489 | 12/1975 | Arcesi et al. | 96/115 R |

*Primary Examiner*—Mary F. Kelley
*Attorney, Agent, or Firm*—Dana M. Schmidt

[57] ABSTRACT

Merocyanine dyes comprising 2-(heterocyclylcarbonylmethylene)thiazolines and selenazolines and 2-[di(heterocyclylcarbonyl)methylene]thiazolines and selenazolines are efficient sensitizers for light-sensitive unsaturated materials such as unsaturated vesiculators which release a gas upon exposure to radiation, photocrosslinkable unsaturated polymers, and azides such as photocrosslinkable polymeric azides used in photomechanical resists and lithographic plates.

15 Claims, No Drawings

SENSITIZERS FOR PHOTOCROSSLINKABLE POLYMERS

This is a division of application Ser. No. 678,805, filed Apr. 21, 1976 now U.S. Pat. No. 4,062,686.

This invention relates to merocyanine dyes comprising 2-(heterocyclylcarbonylmethylene) thiazolines and selenazolines and 2-[di(heterocyclylcarbonyl)methylene]thiazolines and selenazolines, the photosensitization of light-sensitive materials and particularly to the photosensitization of light-sensitive unsaturated materials such as unsaturated vesiculators which release a gas upon exposure to radiation, and photocrosslinkable unsaturated polymers, and azides such as photocrosslinkable polymeric azides used in photomechanical resists and lithographic plates.

It is known in the photographic art to reproduce images by processes which involve imagewise exposure of a radiation-sensitive material to modify the physical characteristics of the material in the areas of the layer which have been exposed. Among the radiation-sensitive materials which have been used in such processes are photohardenable materials such as polymers which are insolubilized or hardened on exposure to actinic radiation. The resulting difference in physical properties between exposed and unexposed areas can be employed to prepare images by such procedures as application of mechanical pressure, application of heat, treatment with solvents, and the like. Thus, the layer can be treated with a solvent for the unhardened material which is a non-solvent for the hardened polymer, thereby removing unhardened material leaving an image of hardened polymer.

Alternatively, the layer can be heated to a temperature which is between the tackifying point of the material in unexposed areas of the layer and the tackifying point for the material in exposed areas of the layer so that the lower melting material can be toned with a colored powder or transferred to a receiving surface. Such processes have been employed to prepare lithographic printing plates, stencils, photoresists, and similar photographic and photomechanical images. However, the speed of photocrosslinkable materials has been relatively slow and it has been desirable to increase the light insolubilization reaction. As a result, many compounds have been proposed in the past as sensitizers. For example, 2-benzoylmethylene-1-methyl[1,2-d]naphthothiazoline (BNTZ), disclosed in U.S. Pat. No. 2,732,301 issued Jan. 24, 1956, is useful as a sensitizer for contact printing materials.

The preparation of BNTZ or its similar compound NeBNTZ, in which an ethyl group replaces the 1-methyl group, requires an involved synthesis so that it has been desirable to provide new sensitizers that have speeds equal to or better than BNTZ (or NeBNTZ) which may be easier to synthesize.

We have now discovered new sensitizers for photosensitive materials, including unsaturated polymers, vesiculators, and azides.

SUMMARY OF THE INVENTION

A photosensitive composition comprises an unsaturated light-sensitive material or a photocrosslinkable azide material which material contains a sensitizing amount of a 2-(heterocyclylcarbonylmethylene)thiazoline or selenazoline or a 2-[di(heterocyclylcarbonyl)methylene]thiazoline or selenazoline having its absorptive maximum between about 340 to about 460 nm. Preferably the sensitizer has the following formula:

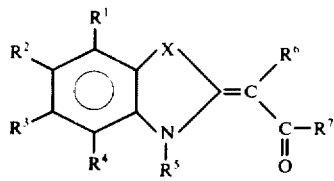

wherein X is a sulfur or a selenium atom; $R^1$, $R^2$, $R^3$ and $R^4$ independently represent hydrogen, lower alkoxy of 1 to 4 carbon atoms or taken together $R^1$ and $R^2$, $R^2$ and $R^3$, $R^3$ and $R^4$ constitute the atoms needed to complete a fused benzo ring; $R^5$ represents lower alkyl of 1 to 4 carbon atoms; $R^6$ represents hydrogen or

where $R^8$ is a heterocyclic group such as furyl or thienyl; $R^7$ is heterocyclyl such as furyl or thienyl.

DETAILED DESCRIPTION OF THE INVENTION

The new class of sensitizers for photocrosslinkable materials are 2-(heterocyclylcarbonylmethylene) thiazolines and selenazolines and 2-[di(heterocyclylcarbonyl)methylene]thiazolines and selenazolines which have an absorptive maximum between about 340 to about 460 nm. These sensitizers preferably have the formula:

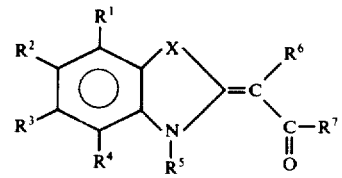

wherein X is a sulfur or a selenium atom; $R^1$, $R^2$, $R^3$ and $R^4$ independently represent hydrogen, lower alkoxy of 1 to 4 carbon atoms such as, for example, methoxy, ethoxy, propoxy, isopropoxy, tert.-butoxy, butoxy, and isobutoxy or taken together $R^1$ and $R^2$, $R^2$ and $R^3$, $R^3$ and $R^4$ constitute the atoms needed to complete a fused benzo ring; $R^5$ represents lower alkyl of 1 to 4 carbon atoms such as, for example, methyl, ethyl, propyl, isopropyl, tert.-butyl, isobutyl, butyl; $R^6$ represents hydrogen or

where $R^8$ is a heterocyclic group such as furyl or thienyl; $R^7$ is heterocyclyl such as furyl or thienyl.

The compounds of the invention are prepared by a simplified version of the procedure of Brooker et al, J. Amer. Chem. Soc. 73, 5326 (1951) and Brooker, U.S. Pat. No. 2,112,139 (1938), wherein a quaternary heterocyclic salt reacts with an anhydride or acid chloride in the presence of pyridine. We have also found that phthalic anhydride may be used to introduce the 1,3- diketoindanylidene moiety into a thiazole or selenazole nucleus.

Typical sensitizers which are useful in our invention are for example:

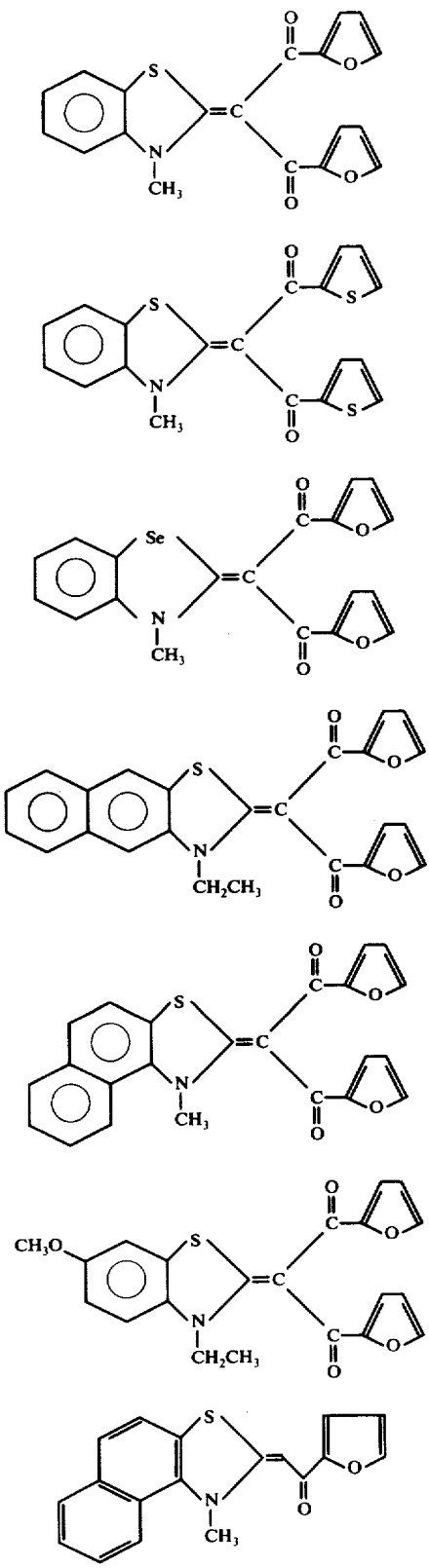

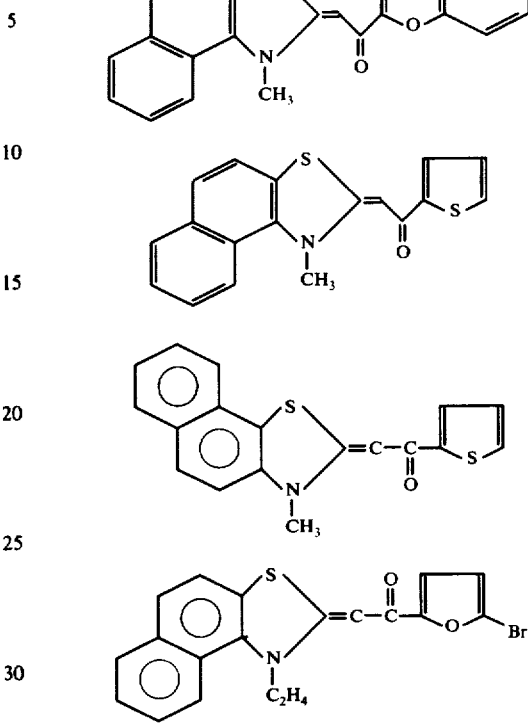

The materials whose light-sensitivity is improved by the sensitizers of this invention are unsaturated vesiculators which release a gas upon exposure to radiation, photocrosslinkable unsaturated polymers, and photocrosslinkable polymeric azides.

Many of these materials are photocrosslinkable or photohardenable. These terms "photocrosslinkable" and "photohardenable" as used herein refer to systems in which the molecular weight of at least one component of the photosensitive layer is increased by exposure to actinic radiation sufficiently to result in a change in the solubility or the rheological and thermal behavior of the exposed areas.

Among suitable photocrosslinkable or photohardenable systems are: those in which the photohardenable group, within or attached to a polymer backbone, becomes activated on exposure to light and may then cross-link by reacting with a similar group or other reactive sites on adjacent polymer chains. Where only dimerization of similar compounds is involved, e.g, cinnamoyl compounds, the average molecular weight of the photosensitive constituent can be at best only doubled by a single photochemical act.

The photocrosslinkable layer can contain added preformed compatible condensation or addition polymers as well as immiscible polymeric or non-polymeric organic or inorganic fillers or reinforcing agents, which are essentially transparent, e.g., the organophilic silicas, bentonites, silica, powdered glass, etc., having a particle size less than 0.4 mil and in amounts varying with the desired properties of the photopolymerizable layer.

The photocrosslinkable layer may be composed of a polymerizable monomer and a polymerizable polymer in admixture with the merocyanine sensitizer. Where a photopolymerizable molecule has more than one reactive site, a cross-linked network can be produced.

A typical crosslinkable photopolymer is disclosed in Murray U.S. Pat. No. 1,965,710 issued July 10, 1934 which describes a resist image formed from a layer of cinnamal ketone containing another resinous material which, after exposure under a design, may be selectively dissolved in the unexposed area whereby the area of the support thus based may be etched. Minsk et al U.S. Pat. Nos. 2,610,120; 2,690,966; 2,670,285; 2,670,286; and 2,670,287 respectively disclose light-sensitive photomechanical resist compositions containing polymeric materials containing combined polymeric units having R — CH = CH — CO groups wherein R is an aryl group such as a phenyl, m-nitrophenyl, etc. sensitized with nitro, triphenylmethane, anthrone, quinone and ketone compounds.

Exemplary photocrosslinkable polymers include cinnamylideneacetate esters of poly(vinyl alcohol), cinnamic acid esters of poly(vinyl alcohol), cinnamic acid esters of cellulose, cinnamic acid esters of hydroxyalkylcellulose, cinnamoylated polystyrene, cinnamyl vinyl ketone polymers, unsaturated polyesters, etc.

Other photocrosslinkable materials which may be sensitized with the sensitizers disclosed herein, are disclosed in Wadsworth et al U.S. Pat. No. 3,779,989 issued Dec. 18, 1973. These are light-sensitive polymers which contain a diarylcyclopropene substituent, such as a diarylcyclopropenium ion or a diarylcyclopropenyl group, directly attached to a phenyl group which in turn is attached to a polymer backbone. These polymers are useful in preparing photomechanical images and for other purposes. Another class of light-sensitive polymers is disclosed in U.S. Pat. No. 3,782,938 issued Jan. 1, 1974 to DeBoer. These light-sensitive polymers have appended to a polymer backbone a light-sensitive unsaturated cyclic group which is a 3- to 6-membered carbocyclic or monocyclic heterocyclic ring containing an ethylenic double bond or a 5- to 6-membered ethylenically unsaturated carbocyclic or heterocyclic ring free of exocyclic double bonds and fused to an aromatic ring of the benzene series.

Additional light-sensitive polymers which can be sensitized with the sensitizers disclosed herein are also disclosed in Schellenberg et al U.S. Pat. No. 3,030,208 issued Apr. 17, 1962. These light-sensitive compounds are soluble polycondensation products predominately linked through ester bonds and having

groups bonded to aromatic nuclei.

Still other photocrosslinkable materials are disclosed in U.S. Pat. No. 3,929,489 issued Dec. 30, 1975 to Arcesi and Rauner entitled "Lithographic Plates Having Radiation Sensitive Elements Developable With Aqueous Alcohol."

In a particularly useful embodiment of the invention the photocrosslinkable material has incorporated into the polymer molecule disulfonamido units having the structural formula:

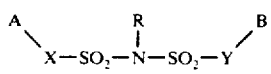

wherein (a) R is selected from the group consisting of —H and an alkali metal, (b) X and Y are the same or different radicals selected from the group consisting of arylene radicals of 6 to about 12 carbons and said radicals being unsubstituted or substituted with chlorine atoms, and (c) A and B are the same or different and are selected from the group consisting of

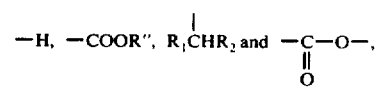

wherein

R" is selected from the group consisting of —H, alkyl of from 1 to about 8 carbon atoms, alkylene of from 2 to about 8 carbon atoms, and aryl of from 6 to about 14 carbon atoms;

$R_1$ is hydrogen or alkyl of from 1 to about 8 carbon atoms and $R_2$ is hydrogen, alkyl of from 1 to about 8 carbon atoms so that at least one of A and B has a valence of 1 as disclosed in Caldwell et al U.S. Pat. No. 3,546,180 issued Dec. 8, 1970.

Exemplary azides which can be sensitized by the compounds of the invention include the poly(vinyl azidobenzoates) and poly(vinyl azidophthalates) of U.S. Pat. Nos. 2,948,610; 3,002,003; and 3,096,311.

The azide polymers can be represented by various formulas. The polymers contain recurring polymeric units which can be represented simply as

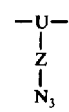

in which U represents the recurring atoms of the polymer chain proper and Z is a linkage joining the azide group to the recurring atoms of the polymer chain, for example, the atoms and groups; — $CH_2$ —, — CO —, phenylene, —$C_6H_4$— $CH_2$— O — CO —, —$C_6H_4$— CO — O —, — $C_6H_4$— O —, —$C_6H_3$(COOH) — CO — O —, and — $C_6H_4$— O — $C_2H_4$— O —. In copolymers, additional polymeric units $U_1$, $U_2$ etc., differing from U are present and the copolymers can therefore be represented as

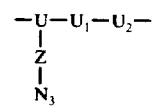

Polymers may also be used which contain recurring units of the structure

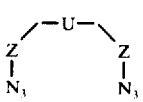

in which the Z's are the same or different linkages such as mentioned above as may be present, for example, in aryl azide derivatives of hydrolyzed cellulose esters in which case two or more azide groups can be adjoined to a single recurring polymeric unit of the cellulosic chain.

Similarly, more than one azide group can be attached to Z as in the case of a diazidophenyl group.

The inherently light-sensitive alkali soluble azide polymers particularly efficacious for use contain recurring units of the formula

in which R is a bivalent aromatic radical of the benzene series whose free valences do not necessarily belong to the aromatic nucleus, for example, phenylene, $-C_6H_4 - CH_2 - O - CO, - C_6H_4 - CO - O -, -C_6H_4 - O -, -C_6H_3(COOH) - CO - O -$ and $-C_6H_4 - O - C_2H_4 - O -$. In some cases the acid group of the inherently light-sensitive alkali soluble azide polymer, such as a carboxyl group, is not attached to the recurring polymeric unit containing the azide group, but may be present on some other recurring unit of the polymer, for example, as in the case of the maleic acid azidostyrene copolymer described hereinafter. In the vinyl azidophthalate copolymers described hereinafter, the carboxyl group is attached directly to the aromatic nucleus bearing the azide group.

Useful light-sensitive film-forming azidostyrene homopolymers contain the following recurring structural unit:

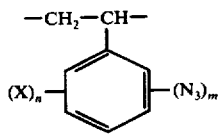

or copolymers of said azidostyrene consist of the following recurring structural units in random combination:

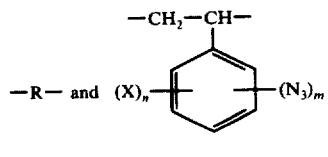

wherein the ratio of II(a) units to II(b) units in each resin molecule can vary from 1:19 to 19:1, i.e. II(b) are present from 5 to 95 mole percent, and wherein m represents in each instance a digit 1 or 2, n represents a digit from 0 to 2, X represents a chlorine atom, an alkyl group containing from 1 to 4 carbon atoms, e.g. methyl, ethyl, propyl, butyl, etc., an alkoxy group containing from 1 to 4 carbon atoms, e.g. methoxy, ethoxy, propoxy, butoxy, etc., and a nitro group, and R represents a unit such as ethylene, isobutylene, a 1,3-butadiene, styrene and substituted styrenes, etc., an α,β-unsaturated mono- or di-carboxylic acid unit such as acrylic acid, an α-alkylacrylic acid, maleic acid, citraconic acid, itaconic acid, etc., and the anhydrides, alkyl esters, imides, N-alkyl imides, nitriles, amides, and N-alkyl and N,N-dialkyl substituted amides of these acids, fumaric and mesaconic acids and their alkyl esters, nitriles, amides and N-alkyl and N,N-dialkyl substituted amides, vinyl alkyl ketones such as vinyl methyl ketone, vinyl halides such as vinyl chloride, vinylidene halides such as vinylidene chloride, and the like units, and wherein in each instance in the above the alkyl and alkoxy groups contain from 1 to 4 carbon atoms.

Unsaturated radiation-decomposable vesiculating agents capable of generating a gas upon imagewise exposure which can be sensitized by sensitizers of our invention include the vesiculating agents of G. L. Fletcher, D. H. Wadsworth and J. E. Jones, in U.S. Application Ser. No. 739,774 entitled Cyclopropenone Vesicular Imanging Composition, Element and Process, filed Nov. 8, 1976.

These vesiculating agents release a gas upon exposure to light. When incorporated in a heat-deformable, relatively gas impermeable film coating, exposed to actinic radiation, and heated, the gas is released upon exposure and allowed to expand on heating because of the softened matrix which is deformed by gas expansion. Upon cooling, the exposed areas are permanently deformed and opaque to the transmission of light, thus images can be viewed by projection if coated on a transparent support. If coated on an opaque substrate, the image appears white, when viewed by reflected light.

Preferred radiation-decomposable vesiculating agents are cyclopropenones having the formula

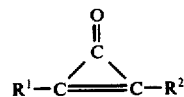

wherein:

$R^1$ and $R^2$ are the same or different, and are each a substituted or unsubstituted aryl radical containing from 6 to 10 carbon atoms in the aromatic ring, or an aralkenyl radical having 6to 10 carbon atoms in the aryl portion such as, for example, phenyl, naphthyl, etc. and 1 to 5 carbon atoms in the alkenyl portion such as, for example, 2,2-diphenylvinyl, 2-phenylvinyl, 2-naphthylvinyl, etc.

The substituents of each of the substituted aryl radicals are one or more radicals selected from the group consisting of 1. an alkyl or alkoxy radical containing from 1 to 5 carbon atoms;
2. a nitro radical;
3. an aryloxy radical containing from 6 to 10 carbon atoms; and
4. a polymer to which the aryl radical is attached as a dependent moiety, the polymer having at least one repeating unit with the formula wherein $(R^1)$ is a lower alkylene radical containing from 1 to 5 carbon atoms.

In a particularly useful embodiment, a polymeric binder is employed which contains the radiation-decomposable vesiculating agent capable of generating a gas upon imagewise exposure. The light-sensitive composition can be coated on any suitable support.

In using the photosensitive polymers of our invention in connection with the preparation of lithographic or relief image plates, the plates are prepared by coating a solution of a light-sensitive polymer and a sensitizer of the invention on a suitable support such as a metal plate or flexible film support such as polyester. After drying, the plate is exposed through a line pattern whereby the polymer in the exposed areas becomes cross-linked and solvent insoluble. The exposed plate is then bathed in a suitable solvent to remove the non-crosslinked polymer in the unexposed areas.

Useful solvents include 1,2-dichloroethane, chlorobenzene, 2-ethoxyethyl acetate, cyclohexanone, water, alcohol, etc.

Suitable support materials can be chosen from among a variety of materials which do not directly chemically react with the coating composition. Such support materials include fiber base materials such as paper, polyethylene-coated paper, polypropylene-coated paper, parchment, cloth, etc.; sheets and foils of such metals as aluminum, particularly grained aluminum, anodized aluminum or grained and anodized aluminum, copper, magnesium, zinc, etc.; glass and glass coated with such metals as chromium, chromium alloys, steel, silver, gold, platinum, etc.; synthetic resin and polymeric materials such as poly(alkyl acrylates), e.g. poly(methyl methacrylate), polyester film base—e.g. poly(ethylene terephthalate), poly(vinyl acetals), polyamides—e.g. nylon and cellulose ester film base—e.g. cellulose acetate, cellulose nitrate, cellulose ester with a hydrolyzed surface, cellulose acetate propionate, cellulose acetate butyrate and the like.

The optimum coating thickness of the radiation-sensitive layer will depend upon such factors as the use to which the coating will be put, the particular radiation-sensitive polymer employed, and the nature of other components which may be present in the coating. Typical coating thicknesses can be from about 0.05 to 10.0 microns or greater, with thicknesses of from 0.1 to 2.5 microns being preferred for lithographic printing plate applications.

Generally the sensitizers of the invention are employed at a concentration of about 0.1 to about 20 percent by weight of the light-sensitive material, preferably about ½ to 6 percent.

The results recorded in the examples that follow were obtained with the general procedure described below.

Light sources which may be used include broad spectrum light sources, filtered or unfiltered, including Xenon or carbon arcs, narrow spectrum sources such as mercury lamps which emit within low (uv) to medium (visible light) wavelengths, and laser sources.

The following examples are included for a further understanding of the invention:

The preparation of representative compounds is shown in Examples 1-4. Satisfactory analyses were obtained for all listed compounds. The melting points, $\lambda_{max}$ and extinction coefficients are given in Table II.

EXAMPLE 1

Preparation of 2-[Bis(furoyl)methylene]-3-methylbenzothiazoline

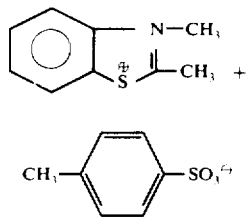

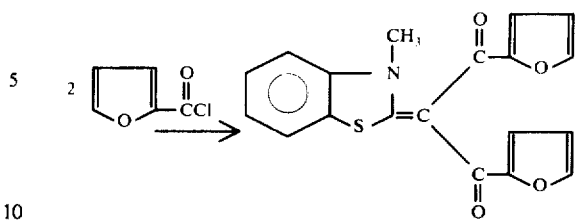

A solution of 7.3 g (0.02 mol) of 1,2-dimethylbenzothiazolium p-toluenesulfonate and 6.0 g (0.046 mol) of 2-furoyl chloride in 30 ml of dry pyridine was heated for two hours on the steam bath. Methanol was added to the reaction mixture and the product collected by filtration to give 6.1 g (87% yield) of product. A melting point of 190° C. (pyridine/methanol) was obtained.

Anal. for $C_{19}H_{13}NSO_4$: Calculated: C = 65.0, H = 3.7, S = 9.1; Found: C = 65.2, H = 3.8, S = 9.0.

EXAMPLE 2

Preparation of 3-methyl-2-(2-furoylmethylene) naphtho[1,2-d]thiazoline

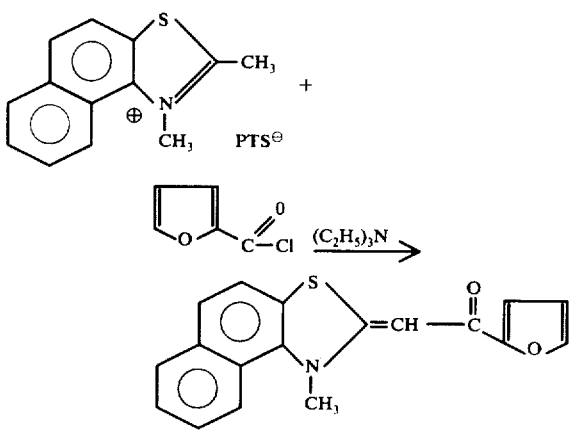

A suspension of 3.86 g (0.01 mole) 2,3-dimethylnaphtho[1,2-d]-thiazolium p-toluenesulfonate and 1.50 g (0.0115 mole) furoyl chloride in 28 ml benzene was stirred and maintained at 16°–19° C. as 2.33 g (0.023 mole) triethylamine was added dropwise over a period of 20 minutes. The reaction mixture was stirred at room temperature for 2 hours. The solid was collected, washed twice with methanol and recrystallized from 100 ml acetonitrile. m.p. 217° C.

Calc: C, 70.33; H, 4.26; N, 4.56; S, 10.43; Found: C, 70.4; H, 4.4; N, 4.3; S, 10.6.

EXAMPLE 3

Preparation of 3-methyl-2-(2-thenoylmethylene) naphtho[1,2-d]thiazoline

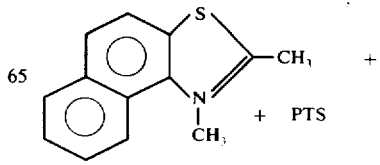

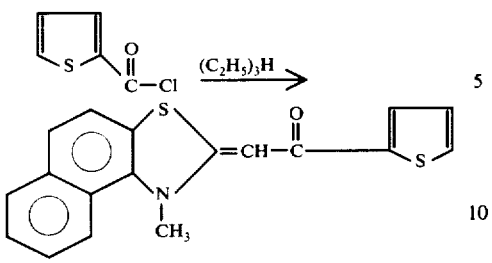

This material was made by exactly the same procedure stated above. m.p. 245° C.

Calc: C, 66.84; H, 4.05; N, 4.33; S, 19.82; Found: C, 67.0; H, 3.9; N, 4.6; S, 20.1.

EXAMPLE 4

Preparation of 3-methyl-2-(2-benzofuroylmethylene)naphtho[1,2-d]thiazoline

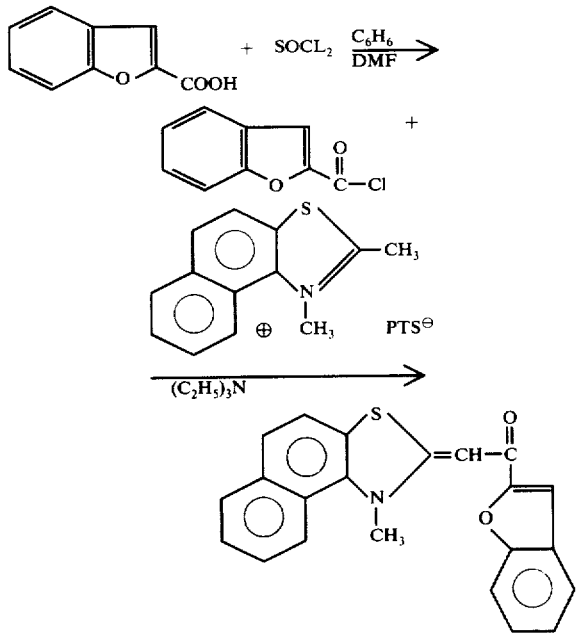

2.02 g (0.0125 mole) coumarilic acid was added to 25 ml dry benzene. 1.55 g (0.130 mole) thionyl chloride and 2 drops dimethylformamide were added to the suspension and the reaction mixture was heated under reflux on a steam bath for 3 hours. After removing from the steam bath, dry nitrogen was briefly bubbled through the solution to remove most of the hydrogen chloride. The solution was cooled to 15° C. and stirred magnetically in a water bath. 2,3-Dimethyl naphtho[1,2-d]thiazolium p-toluene sulfonate 3.86 g (0.100 mole) was added, then 3.5 g triethylamine was added dropwise over a period of 20 minutes and the reaction mixture stirred 1 hour before collecting the solid. The product was suspended in boiling methanol, cooled and collected several times before recrystallizing from 700 ml nitromethane. The mass spectrametric data is consistent for the product.

EXAMPLE 5

Sensitizer Activity in Coatings Containing Photopolymer A*

The log relative speeds of formulations containing photopolymer A and the instant sensitizers were determined and are set out in Table I. The speeds in all cases are at least equivalent to 2-benzoylmethylene-1-ethylnaphtho[1,2-d]thiazoline (NeBNTZ).

*Photopolymer A is a polymer prepared by the condensation of equimolar amounts of p-phenylenediethoxyacrylate and 1,4-di-β-hydroxyethoxycyclohexane.

The effectiveness of the sensitizers in photopolymer A was determined by dissolving 20 mg of dye in 20 ml of the stock solution described below to give a 4% w/w ratio of sensitizer to light-sensitive polymer.

| | | |
|---|---|---|
| Photopolymer A (as a 20% w/w solution in dichloroethane) | 25.0 | g |
| Benzoic acid | 0.2 | g |
| 2,6-Di-t-butyl-p-cresol | 0.1 | g |
| Dichloroethane | 175 | ml |

The resulting solutions were whirl coated at 100 rpm on an anodized aluminum support, prepared as described in U.S. Pat. No. 3,511,661. The dry plates were exposed for one minute behind a Kodak T-14 step wedge to a pulsed xenon light source (Nu Arc Platemaker) and swab-processed with a developer of the following composition:

| | | |
|---|---|---|
| 4-butyrolactone | 892.0 | g |
| Distilled water | 97.0 | g |
| Glycerine | 98.4 | g |
| Phosphoric acid (H$_3$PO$_4$) 85% | 32.9 | g |
| Zonyl A wetting agent* | 8.4 | g |
| Staybelite resin | 0.77 | g |
| Methyl abietate | 8.0 | g |
| Triethanolamine to pH 3.1 | | |

*Zonyl A is a non-ionic ethylene oxide-ester condensate made by the E. I. du Pont de Nemours Company.

In general, the dyes of the invention are equal to or better than 2-benzoylmethylene-1-ethylnaphtho[1,2-d]thiazoline (NeBNTZ).

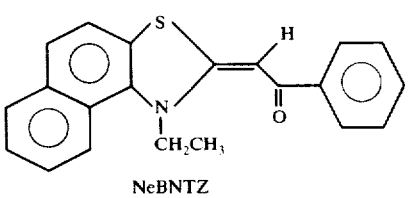

NeBNTZ

Table I

| | | Log. Rel. Sp. |
|---|---|---|
| 1. | 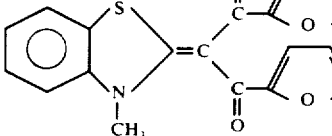 | 1.00 |
| 2. | 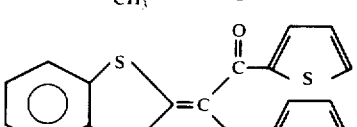 | 1.00 |
| 3. | 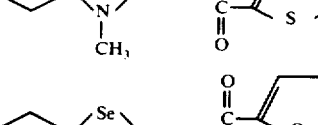 | 1.00 |
| 4. | 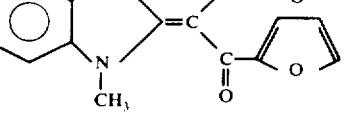 | 1.15 |

EXAMPLE 6

Sensitizer Activity in Coatings Containing Photopolymer B

The effectiveness of the sensitizers in Photopolymer B (Photopolymer B is a polymer prepared by the condensation of poly(vinyl alcohol) (88/12) with 37 mole percent diphenylcyclopropenylcarbonyl chloride and 31 mole percent benzoyl chloride, the final polymer being 37% diphenylcyclopropenylcarboxylate, 31% benzoate, 12% acetate and 20% free hydroxyl),

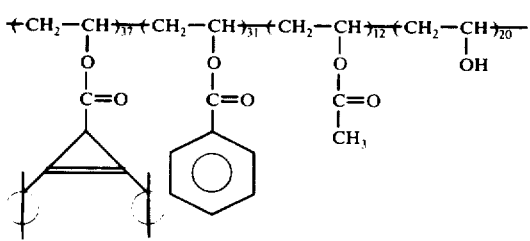

Photopolymer B was determined by dissolving 20 mg of the dyes in 20 ml of the following composition to give a 4% w/w ratio of sensitizer to light-sensitive polymer:

| Photopolymer B | 5.5 | g |
|---|---|---|
| Benzoic acid | 0.03 | g |
| Hydroquinone | 0.03 | g |
| Cyclohexanone | 200 | ml |

The solutions were whirl-coated on an anodized aluminum support prepared as described in U.S. Pat. No. 3,511,661. The dried coatings were exposed behind a Kodak T-14 step wedge to an assembly of four 250-watt mercury lamps at a distance of 1.5 m. for 8 seconds and swab-processed with the same developer composition described in Example 5.

The dyes shown in Examples 7-12 below gave log relative speeds equal to or better than that of NeBNTZ (log. rel. sp. 1.00) with Photopolymer B.

EXAMPLE 7

| | Log. Rel. Sp. |
|---|---|
|  | 1.15 |

EXAMPLE 8

| | |
|---|---|
| 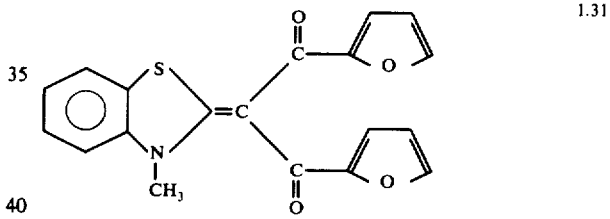 | 1.31 |

EXAMPLE 9

| | Log. Rel. Sp. |
|---|---|
| | 1.31 |

EXAMPLE 10

| | |
|---|---|
| 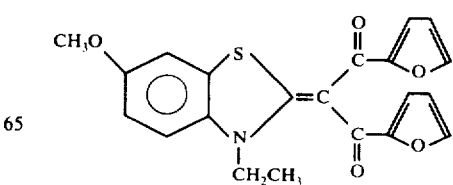 | 1.15 |

EXAMPLE 11

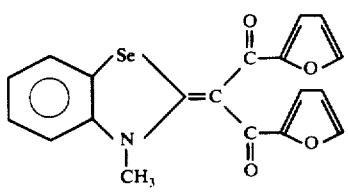

1.46

EXAMPLE 12

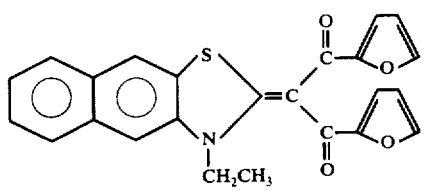

1.15

Melting points and spectral properties of compounds appearing in Table I and Examples 7-12 are given in following Table II.

Table II

| Example No. | m.p. (° C.) | $\lambda_{max}$(nm) | $\epsilon \times 10^{-3}$ (in $CH_3CN$) |
|---|---|---|---|
| 7 | 185 | 405 | 34.0 |
| 8 (I, 1) | 190 | 390 | 33.0 |
| 9 (I, 2) | 212 | 388 | 29.0 |
| 10 | 280 | 400 | 28.0 |
| 11 (I, 3) | 178 | 392 | 32.5 |
| 12 (I, 4) | 280 | 403 | 34.1 |

EXAMPLE 13

Comparison of Various Amounts of BNTZ and BFT Sensitizers in Typical Lithograhic Coating Formulations Containing Photopolymer C*

The coatings were made on cleaned, grained, phosphoric acid-anodized aluminum at 110 mg/ft.$^2$. A drum sample coater (9¼ inches wide coating) was used. The general coating formulation employed was as shown below. The amounts are in weight percent based on the amount of Photopolymer C used.

*Photopolymer C is a poly[1,4-cyclohexylenebis(oxyethylene)-p-phenylenediacrylate]-co-3,3'[(sodio-iminodisulfonyl)benzoate]. The polymer is disclosed in U.S. Pat. No. 3,929,489 issued Dec. 13, 1975.

| | Weight % |
|---|---|
| Photopolymer C | (12 g) |
| 2,6-di-t-Butyl-p-cresoi (butylated hydroxytoluene) | 4.0 |
| Spectral sensitizer | 4, 6 & 8 |
| Tris(dipropylaminophenyl)methane (leuco propyl violet) | 4.0 |
| N-methoxy-4-methylpyridinium-p-toluenesulfonate (quaternized accelerator) | 4.0 |
| Dihydro anhydro piperidino hexose reductone (DAPHR - antioxidant) | 0.4 |
| Pigment-Monastral Blue BF | 10.0 |
| 1,2-Dichloroethane | |

The spectral sensitizers were A) BNTZ, (2-benzoyl-methylene-1-methylnaphtho[1,2-d]thiazoline) and B) BFT, 2-[bis(2-furoyl)methylene]-1-methylnaphtho[1,2-d]thiazoline. Each coating was given a 75 unit xenon source exposure through a Kodak T-14 guide. The exposed coatings were processed as in Example 5. The log relative speeds, corresponding to the density of the last solid step reproduced from the guide, are given in Table III for all of the coatings.

Table III

| Sensitizer | Weight % Sensitizer | Log Relative Speed |
|---|---|---|
| A | 4 | 0.85 |
| A | 6 | 1.01 |
| A | 8 | 1.01 |
| B | 4 | 1.31 |
| B | 6 | 1.31 |
| B | 8 | 1.60 |

These results in Table III amply demonstrate the significant speed increases over BNTZ that are obtainable when BFT is used to sensitize Photopolymer C. For example, at 4% level of sensitizer to polymer BFT is 2.9 times faster than BNTZ. At the 6% level, BFT is 2 times faster than BNTZ, and at 8% BFT is 3.9 times faster than BNTZ.

EXAMPLE 14

Efficiency of BFT Relative to NeBNTZ

This experiment demonstrates how the spectral response range of 2-[Bis(2-furoyl)methylene]-1-methyl-naphtho[1,2-d]thiazoline (BFT) can be broadened with increased concentration to a signficantly greater degree than is possible with a similar increase in concentration of NeBNTZ. The following solutions were prepared and coated onto grained, subbed aluminum strips for testing.

| 1) Photopolymer B | 7.5 | g |
|---|---|---|
| Monastral Blue B Pigment (duPont Company) | 0.78 | g |
| NeBNTZ | 1.2 | g |
| 1,2-Dichloroethane | 300 | ml |
| 2) Same as (1) except NeBNTZ was replaced by 1.2 g of BFT. | | |

Both solutions contained 16% wt/wt ratio of sensitizer to polymer).

A sample of each coating was exposed at 405 nm, 436 nm and 488 nm on a time-modulated spectral sensitometer with a 1,000 watt high-pressure xenon lamp and a Bausch and Lomb high-intensity monochrometer. The band width at high peak intensity was 10 nm. After exposing, each sample was swab processed with the same developer composition of Example 5. The minimum exposure to produce a maximum density image was determined for each sensitizer. The results are given in Table IV.

Table IV

| Sensitizer | Minimum Exposure of Produce a Maximum Density Image (ergs/cm$^2$) | | |
|---|---|---|---|
| | 405 nm | 436 nm | 488 nm |
| NeBNTZ | $1.6 \times 10^4$ | $2.3 \times 10^4$ | $6.3 \times 10^6$ |
| BFT | $6.4 \times 10^3$ | $6.4 \times 10^3$ | $2.8 \times 10^5$ |

These results demonstrate the superior ability of BFT over NeBNTZ to sensitize Photopolymer B to energy at a wavelength of 488 nm.

EXAMPLE 15

Effect of Sensitizers on Speed and Spectral Response In Coatings Containing Photopolymer B This experiment shows the effect of varying the wt/wt ratio of Sensitizer/Polymer from 2% to 16%.

Simple solutions of Photopolymer B and various concentrations of sensitizers in cyclohexanone solvent were whirl-coated onto grained, subbed aluminum. The dried coverage of each coating was about 0.91 g/m² (85 mg/ft²). Contact exposures were made through a Kodak T-14 test negative using four 250-watt mercury street lamps at a distance of 150 cm (340 foot-candles) for eight seconds. Wedge spectrograms were obtained using a converted Bausch and Lomb monochromator with a 1,000-watt xenon source on samples containing 8% sensitizer. All plates were swab-processed with the same developer composition mentioned in Example 5. Results of these experiments are shown in Table V.

3.08 gm of acetone, 3.08 gm of 2-methoxyethanol solvent. A clear solution resulted in each case by stirring the reactants together at room temperature. One solution was sensitized by adding 0.018 gm of BFT sensitizer. The sensitizer was dissolved by stirring at room temperature. The second solution was maintained without sensitization for comparative purposes. The polymer solutions were each coated on 4 mil thick poly(ethylene terephthalate) film support to a wet thickness of 5 mil. The coatings were dried by warming in a moving air stream to 24° C. followed by three minutes heating at 65.5° C. The coatings were further dried by flash heating to 150° C. for 10 seconds on a heated platen.

Table V

| | Relative Effectiveness of Sensitizers With Photopolymer B | | | | |
|---|---|---|---|---|---|
| | Log Relative Speed (1) Sensitizer/Polymer (wt/wt) | | | | Useful Range of Spectral Response at 8% Sensitizer |
| Sensitizer | 2% | 4% | 8% | 16% | Level |
| 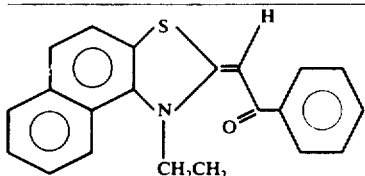 2-benzoylmethylene-1-ethyl naphtho[1,2-d]thiazoline (NeBNTZ) Control | 0.85 | 1.16 | 1.16 | 0.85 | 340–440 nm |
| 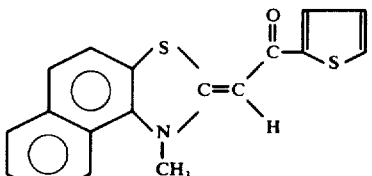 2-[(2-thenoyl)methylene]-1-methylnaphtho[1,2-d]thiazoline | — | — | 1.30 | — | 340–460 nm |
| 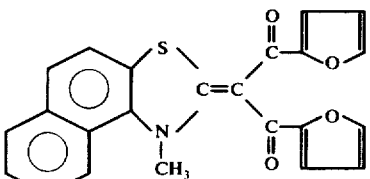 2-[bis(2-furoyl)methylene]-1-methylnaphtho[1,2-d]thiazoline (BFT) | 1.16 | 1.30 | 1.45 | 1.45 | 340–460 nm |
| 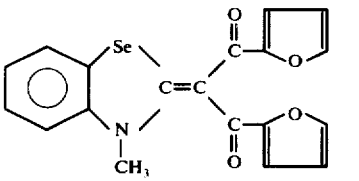 2-[bis(1-furoyl)methylene]-3-methylbenzoselenazoline | 1.30 | 1.45 | 1.60 | 1.45 | 340–460 nm |

(1) Density of T-14 step corresponding to last solid step reproduced on plate.

EXAMPLE 16

Example of Cyclopropenone Vesicular Element Sensitized With BFT

Two polymer solutions were prepared each containing the following: Three quarters of a gram of the polymer poly(ethylene-co-1,4-cyclohexylenedimethylene-1-methyl-2,4-benzenedisulfonamide), 200 mg of 2-(4-methoxyphenyl)-3-phenylcyclopropenone vesiculator, The two photographic elements with and without BFT sensitization were exposed on an IBM Photocopier Model II-D for an equal length of time through a 0.15 Log E step wedge. The vesicular image was developed, following exposure by heating the film to 128° C. for 3 seconds. The density of the film at various exposure steps was measured on a densitometer and plotted on an H & D curve. The inclusion of the sensitizer in the film increases the film speed by approximately 0.15 Log E.

EXAMPLE 17

A series of coatings were prepared by whirl coating 2% solution of poly(vinyl acetate-co-vinyl azidobenzoate) in cyclohexanone on unsubbed aluminum without additional sensitizer and with $6 \times 10^{-3}$M concentration of the respective sensitizers shown in the following table. Each coating was irradiated through a step tablet for the same length of time using a high-pressure mercury lamp, and developed with cyclohexanone. The results are as shown in Table VI.

Table VI

| Sensitizer | Speed Relative to the Unsensitized Sample | Speed Relative to BNTZ |
|---|---|---|
| None | 1 | 0.025 |
| 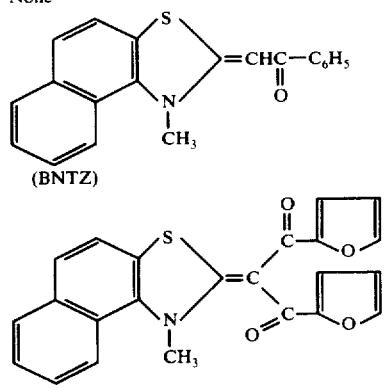 (BNTZ) | 40 | 1 |
| (structure with two furoyl groups) | 70 | 1.75 |

Table VI-continued

| Sensitizer | Speed Relative to the Unsensitized Sample | Speed Relative to BNTZ |
|---|---|---|
| (BFT) | | |

The evaluation was based on comparison of the optical density of the steps giving matching images.

Test Procedure

In each of Examples 18–19, $6 \times 10^{-5}$ mole of sensitizer is dissolved in 10 ml of a 2% solution of the light sensitive polymer in either cyclohexanone or dichloroethane. Five milliliters of this solution is spin coated on aluminum. Strips of the dried coatings are exposed through a 0.15 O.D. incremented step wedge and developed by dissolving away the non-crosslinked polymer in a tray of dichloroethane.

Three different light sources are used in the following tests:

A. Ozamatic Source — a commercial unit which uses a full spectrum, high pressure mercury lamp.

B. 405 nm — the wavelength of the mercury line isolated by filtration of a high pressure mercury lamp.

C. 436 nm — the wavelength of the mercury line isolated by filtration of a high pressure mercury lamp.

EXAMPLE 18

Polyvinyl cinnamate

| | RELATIVE SPEED | | |
|---|---|---|---|
| | Ozalid Ozamatic Source | 405 nm | 436 nm |
| A (BNTZ) | 1 | 1 | 1 |
| B | 1 | 1 | 1 ½ |
| C | 1 | ½ | 2 |

-continued

| | RELATIVE SPEED | | |
|---|---|---|---|
| | Ozalid Ozamatic Source | 405 nm | 436 nm |
| D | 1 | 1 | 2 |
| E | 0.95 | — | — |
| F | 0.9 | — | — |

EXAMPLE 19
Photopolymer B

| | RELATIVE SPEED | | |
|---|---|---|---|
| | Ozalid Ozamatic Source | 405 nm | 436 nm |
| (BNTZ) | 1 | 1 | 1 |
| | 1 | — | 2 |

The invention has been described in detail with particular reference to certain preferred embodiments thereof, but it will be understood that variations and modifications can be effected within the spirit and scope of the invention.

What is claimed is:

1. In a photosensitive composition comprising a photocrosslinkable azide polymer and a sensitizer in an amount sufficient to sensitize said polymer;
   the improvement wherein said sensitizer has the following formula:

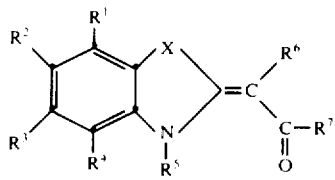

wherein X is a sulfur or a selenium atom; $R^1$, $R^2$, $R^3$, and $R^4$ independently represent hydrogen, lower alkoxy of 1 to 4 carbon atoms or taken together $R^1$ and $R^2$, $R^2$ and $R^3$, $R^3$ and $R^4$ constitute the atoms needed to complete a fused benzo ring; $R^5$ represents lower alkyl of 1 to 4 carbon atoms; $R^6$ represents $$-\overset{\|}{\underset{O}{C}}R^8$$

where $R^8$ is furyl or thienyl; $R^7$ is furyl or thienyl.

2. A photosensitive composition of claim 1 in which said material contains from about 0.1 to about 20 percent by weight of said sensitizer.

3. In a photosensitive composition comprising a photocrosslinkable azide polymer;
   and a sensitizer in an amount sufficient to sensitize said polymer;
   the improvement wherein said sensitizer is a 2-[di(-heterocyclylcarbonyl)methylene]thiazoline or selenazoline having its absorptive maximum between about 340 and about 460 nm.

4. A photosensitive composition of claim 3 in which said sensitizer is a 2-[di(heterocyclylcarbonyl)methylene] thiazoline.

5. A photosensitive composition of claim 3 in which said sensitizer is a 2-[di(heterocyclylcarbonyl)methylene] selenazole.

6. A photosensitive composition of claim 3 in which said sensitizer is 2-[bis(2-furoyl)methylene]-1-methylnaphtho [1,2-d]thiazoline.

7. A photosensitive composition of claim 3 in which said sensitizer is 2-[bis(2-thenoyl)methylene]-1-methylnaptho [1,2-d]thiazoline.

8. A photosensitive composition of claim 3 which said sensitizer is 2-[bis(2-furoyl)methylene]-3-methylbenzoselenazoline.

9. In a photographic element comprising
a support having thereon a photosensitive composition comprising a photocrosslinkable azide polymer;
and a sensitizer in an amount sufficient to sensitize said polymer;
the improvement wherein said sensitizer is a 2-[di(heterocyclylcarbonyl)methylene]thiazoline or selenazoline having its absorptive maximum between about 340 to about 460 nm.

10. In a photographic element comprising a support having thereon a photosensitive composition comprising a photocrosslinkable azide polymer and a sensitizer in an amount sufficient to sensitize said polymer; the improvement wherein said sensitizer has the following formula:

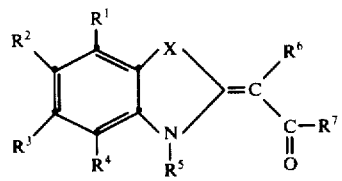

wherein X is a sulfur or a selenium atom; $R^1$, $R^2$, $R^3$ and $R^4$ independently represent hydrogen, lower alkoxy of 1 to 4 carbon atoms or taken together $R^1$ and $R^2$, $R^2$ and $R^3$, $R^3$ and $R^4$ constitute the atoms needed to complete a fused benzo ring; $R^5$ represents lower alkyl of 1 to 4 carbon atoms; $R^6$ represents

where $R^8$ is furyl or thienyl; $R^7$ is furyl or thienyl.

11. An element of claim 10 in which said sensitizer is 2-[bis(2-furoyl)methylene]-1-methylnaphtho[1,2-d]thiazoline.

12. An element of claim 10 in which said sensitizer is 2-[bis(2-thenoyl)methylene]benzothiazoline.

13. An element of claim 10 in which said sensitizer is 2-[bis(2-furoyl)methylene]-3-methylbenzoselenazoline.

14. An element of claim 10 in which said sensitizer is a 2-[di(heterocyclylcarbonyl)methylene]selenazoline.

15. An element of claim 10 in which said sensitizer is a 2-[di(heterocyclylcarbonyl)methylene]thiazoline.

* * * * *

UNITED STATES PATENT AND TRADEMARK OFFICE
CERTIFICATE OF CORRECTION

PATENT NO. : 4,119,466

DATED : October 10, 1978

INVENTOR(S) : James Albert VanAllan, Michael Paul Cunningham, Donald Paul Specht and Samir Yacoub Farid It is certified that error appears in the above-identified patent and that said Letters Patent are hereby corrected as shown below:

Column 23, claim 8, line 1, insert --in-- after "3" and before "which".

Signed and Sealed this

Fifth Day of June 1979

[SEAL]

Attest:

RUTH C. MASON
*Attesting Officer*

DONALD W. BANNER
*Commissioner of Patents and Trademarks*